Sept. 8, 1970 C. O. FORGE 3,527,966
PULSE CIRCUIT USING STEP-RECOVERY DIODES
Filed June 23, 1967
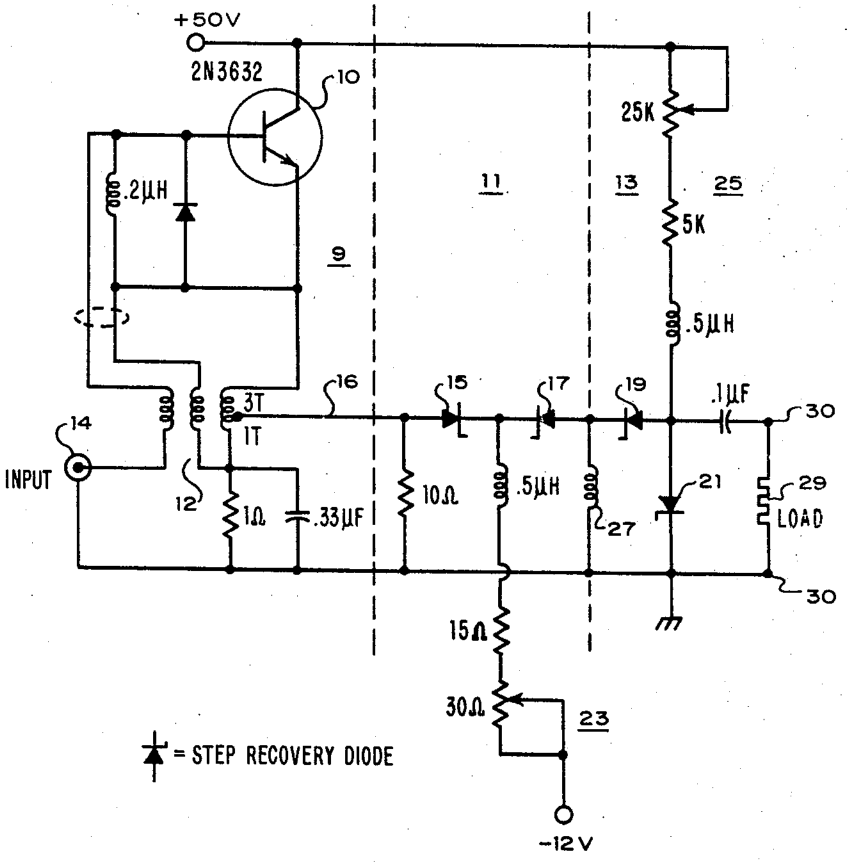
INVENTOR
CHARLES O. FORGE
BY Q. C. Smith
ATTORNEY

United States Patent Office 3,527,966

Patented Sept. 8, 1970

3,527,966

PULSE CIRCUIT USING STEP-RECOVERY DIODES

Charles O. Forge, Cupertino, Calif., assignor to Hewlett-Packard Company, Palo Alto, Calif., a corporation of California Filed June 23, 1967, Ser. No. 648,454

Int. Cl. H03k 3/33

U.S. Cl. 307—319 4 Claims

ABSTRACT OF THE DISCLOSURE

An improved pulse-forming circuit uses cascaded stages of paired step-recovery diodes to sharpen an applied pulse in successive stages.

SUMMARY OF THE INVENTION

In accordance with the illustrated embodiment of the present invention, a first stage pulse sharpener includes a pair of step-recovery diodes connected to apply a sharpened input pulse to a succeeding sharpening stage including a pair of step-recovery diodes. An input pulse to a stage reverse biases one of the step-recovery diodes of the pair to deplete charge stored therein and effectively transfer the stored charge to the other step-recovery diode of the pair. The pulse-sharpening stages may thus be sequentially triggered repetitively and at very rapid rates for the transferring of stored charge eliminates recharging delays.

BRIEF DESCRIPTION OF THE DRAWING

Referring now to the drawing, the input stage 9 includes a transistor 10 and a transformer 12 connected to switch rapidly on signals applied to input 14. Transistor 10 thus saturates and produces a pulse of relatively slow rise time on the input line 16 of the first stage 11. The first stage 11 and second stage 13 each include pairs of step-recovery diodes 15, 17, and 19, 21 connected to be forward biased by the associated bias supplies 23 and 25, respectively. Thus the pulse from the input stage appearing on line 16 is conducted in the forward direction through diode 15, in the reverse direction through diode 17 and through the interstage coupling inductor 27. Reverse current of conduction through diode 17 continues until the charge stored in the junction region of this diode during forward conduction is depleted. This produces a voltage across inductor 27 that tends to reverse bias diode 19, thereby causing stored charge to build up in diode 21. The sudden depletion of stored charge in diode 17 produces an abrupt transition in the reverse conduction characteristic of the diode which then terminates reverse current flow through diode 17. However, the current flow in inductor 27 due to reverse current through diode 17 continues to flow in the same direction and thus draws current in the forward conduction direction through diode 19 and in the reverse conduction direction through diode 21. When the charge stored in the junction region of diode 21 during forward-biased conduction of current from bias supply 25 is depleted, the reverse conduction characteristic of the diode 21 changes abruptly to terminate current flow through the diode 21. The diodes in the first stage 11 are more heavily biased in the forward conduction direction than are the diodes in the second stage to ensure sufficient energy stored in inductor 27. Thus, since current continues to flow in the inductor 27, current immediately switches from flowing through diode 21 to flowing from the succeeding stage, here the load 29 connected to the output terminals 30 that are connected to receive the signal across diode 21. The load 29 receives a current impulse of short duration having a rise time which is comparable to the step-recovery time of diode 21, typically about $200 \times 10^{-12}$ seconds. The duration of the current impulse in load 29 is determined substantially as a half wave of the resonant response of the inductance of inductor 21 and the capacitance of the reverse-biased junction of diode 21.

Once transistor 10 is rendered nonconductive under the control of the signal applied to input 14, the forward bias conditions are then restored in diode 17 due to the forward bias current supply 23 and the flyback in the transformer 12. This restores the voltage across inductor 27 substantially to zero, thereby allowing forward bias current supply 24 to restore forward bias current through diode 21. The circuit can again be triggered to produce a sharp rise-time output pulse.

It should be noted that the total stored charge in the pair of diodes in each stage 11, 13 remains relatively constant during the operation previously described. It can be shown that the total charge stored in the junction region of a diode is equal to the product of the forward bias current I and the carrier lifetime $\tau$ of a diode. Thus it can be seen that the charge originally stored by diode 17 during forward conduction is effectively transferred to and stored by diode 15 due to the higher forward current I therethrough and the total stored charge of the pair of diodes remains substantially constant. Similarly, the stored charge in diode 21 is effectively transferred to diode 19 due to the higher forward conduction current I therethrough so that the stored charge for the pair of diodes remains substantially constant. This constant total charge stored by each pair of diodes assures that charge depleted from one of the diodes is momentarily transferred to and stored in the other diode of the pair. This charge is thus instantly available without undesirable buildup time for transfer back to the diode upon reestablishment of forward-biased conduction. Thus, as long as the driving signal at line 16 is sufficiently large to transfer all of the charge to either diode, the charge transferred is dependent only upon forward bias current I and not upon the frequency of the driving signal. The present circuit may therefore be operated on a single input event or on a recurring input signal having a period less than the lifetime of the step-recovery diodes used in the circuit.

What is claimed is:

1. A pulse circuit comprising:

first and second step-recovery diodes, each capable of storing charge during forward conduction of current therethrough, said diodes being conductive in the reverse direction during the presence of charge stored therein and showing an abrupt transition in the reverse conduction direction in response to the sudden depletion of stored charge;

circuit means connected to said diodes for applying current therethrough in the forward conduction direction;

means including an inductor coupling said diodes together;

means connected to supply current to said inductor through said first diode in the reverse conduction direction in response to an input signal;

said means including said inductor coupling said diodes together being responsive to the sudden depletion of stored carriers in said first diode for reversing the flow of current through said second diode;

output terminals for connection to a utilization circuit; and means connecting said second diode to said output terminals to produce an output pulse at said output terminals for application to a utilization circuit connected to said output terminals in response to the sudden depletion of stored carriers in said second diode.

2. A pulse circuit as in claim 1 wherein:

said means connected to supply current to said inductor through said first diode includes a third diode serially connected in conduction opposition with said first diode for applying an input signal thereto;

said means including said inductor also includes a fourth diode serially connected in conduction opposition with said second diode;

said circuit means supplying current to the common connections of each of the first-third and second-fourth pairs of said serially-connected diodes; and said inductor is connected to the common connection of said first and said fourth diodes for coupling said pairs of serially-connected diodes together.

3. A pulse circuit as in claim 2 wherein:

all of said diodes are serially connected to receive an input signal at the end terminals of the series connection, said first and third diodes are connected in conduction opposition, said second and fourth diodes are connected in conduction opposition and said first and fourth diodes are connected in common conduction direction with said inductor connected in shunt with the series connection of said second and fourth diodes; and said output terminals for connection to a utilization circuit are connected to receive the signal appearing across said second diode.

4. A pulse circuit as in claim 2 wherein:

said third and fourth diodes are step-recovery diodes, each capable of storing charge during forward conduction of current therethrough, said diodes being conductive in the reverse direction during the presence of charge stored therein and showing an abrupt transition in the reverse conduction direction in response to the sudden depletion of stored charge.

References Cited

UNITED STATES PATENTS

| | | | |
|---|---|---|---|
| 3,168,654 | 2/1965 | Lewis | 307—319 |
| 3,209,171 | 9/1965 | Amodei | 307—319 |
| 3,225,220 | 12/1965 | Cubert | 307—281 X |
| 3,385,982 | 5/1965 | Raillard et al. | 307—319 |

DONALD D. FORRER, Primary Examiner

J. D. FREUR, Assistant Examiner

U.S. Cl. X.R.

307—280, 281, 320

UNITED STATES PATENT OFFICE

CERTIFICATE OF CORRECTION

Patent No. 3,527,966 Dated September 8, 1970

Inventor(s) Charles O. Forge

It is certified that error appears in the above-identified patent and that said Letters Patent are hereby corrected as shown below:

Column 2, line 13, "24" should read -- 25 --; line 54, "applying" should read -- supplying --.

SIGNED AND SEALED NOV 17 1970

NOV. 17, 1970

(SEAL)
Attest:

Edward M. Fletcher, Jr.
Attesting Officer

WILLIAM E. SCHUYLER, JR.
Commissioner of Patents